(12) United States Patent
Chen et al.

(10) Patent No.: US 6,636,313 B2
(45) Date of Patent: Oct. 21, 2003

(54) METHOD OF MEASURING PHOTORESIST AND BUMP MISALIGNMENT

(75) Inventors: Yen-Ming Chen, Hsin-Chu (TW);
Chia-Fu Lin, Hsin-Chu (TW);
Kai-Ming Ching, Taiping (TW);
Chao-Yuan Su, Hsin-Chu (TW);
Hsin-Hui Lee, Hsin-Chu (TW);
Li-Chih Chen, Taipei (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 69 days.

(21) Appl. No.: 10/045,413

(22) Filed: Jan. 12, 2002

(65) Prior Publication Data

US 2003/0133115 A1 Jul. 17, 2003

(51) Int. Cl.⁷ .................... G01B 11/00; G01B 11/26; H01L 21/44; H01L 23/48; B21D 39/00
(52) U.S. Cl. .................. 356/401; 356/138; 356/399; 438/108; 438/113; 438/114; 438/125; 438/401; 438/612; 438/613; 257/737; 257/738; 257/762; 257/797; 228/174; 228/254
(58) Field of Search ................... 356/401, 138, 356/399; 438/108, 113, 114, 401, 612, 613, 125; 257/737, 738, 762, 797; 228/174, 254

(56) References Cited

U.S. PATENT DOCUMENTS

| | | | | |
|---|---|---|---|---|
| 5,318,666 A | * | 6/1994 | Elkind et al. | |
| 5,587,342 A | * | 12/1996 | Lin et al. | |
| 6,179,200 B1 | * | 1/2001 | Kung et al. | |
| 6,426,281 B1 | * | 7/2002 | Lin et al. | |
| 6,426,556 B1 | * | 7/2002 | LIn | |

* cited by examiner

*Primary Examiner*—Frank G. Font
*Assistant Examiner*—Khaled Brown
(74) *Attorney, Agent, or Firm*—Tung & Associates

(57) ABSTRACT

A method including the acts of providing a semiconductor device having a plurality of misalignment ruler markers formed therein for measuring removable layer opening misalignment in the X and Y directions, a bond pad and the passivation layer with an opening therein down to the bond pad. A removable layer is formed over the semiconductor device and includes an opening therein down to the bond pad. Preferably this action includes depositing, patterning and developing a dry photoresist film layer over the semiconductor device with an opening therein down to the bond pad. The next act includes measuring the misalignment of the opening in the passivation layer by counting the number of misalignment ruler markers visibly exposed by the opening in the X-direction and also the Y-direction.

20 Claims, 3 Drawing Sheets

METHOD OF MEASURING PHOTORESIST AND BUMP MISALIGNMENT

FIELD OF THE INVENTION

This invention relates to a method of making a bump on a substrate, and more particularly, to a method of making a bump on a substrate using a unique method of measuring photoresist and bump misalignment.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill. A brief description of the prior art methods of performing the first step will provide a better background for understanding the present invention.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

In fabricating a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer such as $SiO_2$, via holes are then etched through the wafer passivation layer to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350° C. to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. A photoresist layer is deposited over the UBM. The portions of the UBM are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

However, before the electrically conductive material such as gold, copper, aluminum, nickel or solder may be deposited onto the UBM, it is typical to provide a photoresist layer over the wafer and form openings or vias in the photoresist layer down to the UBM. At this point, it is important to make sure that the openings or vias in the photoresist layer are precisely positions and not misaligned. If the openings in the photoresist layer are misaligned, the photoresist layer can be stripped off, and a photoresist layer can be deposited again, patterned and developed to correctly positions openings. If the electrically conductive material is deposited into misaligned openings in the photoresist layer, it becomes much more difficult and costly to correctly the problem thereafter. The present invention provides an alternative method of measuring bump misalignment or misalignment of openings in the photoresist layer.

SUMMARY OF THE INVENTION

One embodiment of the invention is a method including the acts of providing semiconductor device having a plurality of spaced apart misalignment ruler markers formed therein for measuring the misalignment of the opening in a removable layer in the X and Y directions, and a bond pad formed therein, depositing a removable layer over the semiconductor device, and wherein the removable layer includes an opening formed therein down to the bond pad, and measuring the misalignment of the opening in the removable layer by counting the number of misalignment ruler markers exposed by the opening in the X-direction and the Y-direction.

In another embodiment of the invention the plurality of misalignment ruler markers includes at least a first set of spaced apart lines.

In another embodiment of the invention each of the misalignment ruler markers comprises the same material as the bond pad.

In another embodiment of the invention the plurality of alignment ruler markers includes first, second, third, and fourth sets of spaced apart lines, and wherein the first set of spaced apart lines is positioned on an opposite side of the bond pad from the third set of spaced apart lines so that the first and third sets of spaced apart lines are usable to measuring the misalignment of the opening in the removable layer and the Y-direction, and wherein the second set of spaced apart lines is positioned on an opposite side of the bond pad from the fourth set of spaced apart lines so that the second and fourth sets of spaced apart lines are usable to measure the misalignment of the opening in the removable layer and the X-direction.

In another embodiment of the invention the spaced apart lines of each set are spaced apart from each other an equal distance.

Another embodiment of the invention the spaced apart lines of each set are spaced apart from each other 1 micron.

In another embodiment of the invention the removable layer comprises a photoresist.

Another embodiment of the invention the removable layer comprises a dry film photoresist.

Another embodiment of the invention further includes the act of determining whether the measure to misalignment of the opening in each of the X-direction and the Y-direction are within an acceptable tolerance range.

Another embodiment of the invention further includes the acts of determining whether the measure the misalignment of the opening in each of the X-direction and the Y-direction are within an acceptable tolerance range, and if the measure of alignment is outside of the acceptable tolerance range, then removing the removable layer, adjusting the process equipment and tools to compensate for the measured misalignment of the opening in the removable layer, and repeating the acts of depositing the removable layer, measuring the misalignment of the opening in the movable layer, and determining whether the measured misalignment of the opening in each of the X-direction and Y-direction are within an acceptable range.

Another embodiment that the invention includes the acts of determining whether the measured misalignment of the opening in each of the X-direction and Y-direction are within acceptable tolerance range, and if the measure misalignment is within the acceptable tolerance range then depositing an under bump metallurgy into the opening in the removable layer, depositing an electrically conductive bump material into the opening in the removable layer and over the under bump metallurgy, removing the removable layer, and reflowing the electrically conductive bump material to form a bump on the semiconductor device.

Another embodiment of the invention further includes the act of viewing the semiconductor device through an optical microscopes in order to perform the acts of counting the number of misalignment ruler markers exposed by the opening.

Another embodiment of the invention includes a method including the acts of providing a semiconductor device having a plurality of spaced apart misalignment ruler markers formed therein for measuring the misalignment of an opening in a removable layer in the X and Y directions, and a bond pad formed therein, depositing a removable layer over the semiconductor device, and wherein the removable layer includes an opening formed therein down to the bond pad, measuring the misalignment of the opening in the removable layer by counting the number of misalignment ruler markers exposed by the opening in X-direction and Y-determining if the measured misalignment is within an acceptable tolerance range, and if the measured misalignment is outside of the acceptable tolerance range, then removing the removable layer, adjusting the process equipment and tools to compensate for the measured misalignment of the opening in the removable layer, and repeating the acts of depositing the removable layer, measuring the misalignment of the opening in the removable layer, and determining if the measured misalignment is within the acceptable range until the measured misalignment of the opening is within the acceptable range and thereafter performing the acts of depositing electrically conductive bump material into the opening in the removable layer, removing the removable layer, and reflowing an electrically conductive bump material to form a bump on the semiconductor device.

In another embodiment of the invention the removable layer comprises a photoresist layer.

In another embodiment of the invention the removable layer comprises a dry film photoresist layer.

In another embodiment of the invention the plurality of misalignment ruler markers includes at least a first set of spaced apart lines.

In another embodiment of the invention the misalignment ruler markers comprises same material as the bond pad.

In another embodiment of the invention the plurality of misalignment ruler markers includes first, second, third and fourth sets of spaced apart lines, and wherein the first set of spaced apart lines is positioned on an opposite side of the bond pad from the third set of spaced apart lines, so that the first and third sets of spaced apart lines are usable to measure the misalignment of the opening in the removable layer and the Y-direction, and wherein the second set of spaced apart lines is positioned on an opposite side the bond pad from the fourth set of spaced apart lines so that the second and fourth sets of spaced apart lines are usable to measure the misalignment of the opening and the removable layer and the X-direction.

In another embodiment of the invention the spaced apart lines of each set are spaced apart from each other and equal distance.

In another embodiment of the invention the spaced apart lines of each set are spaced apart from each other 1 micron.

These and other objects, features and advantages of the present invention will become apparent from the following brief description of the drawings, detailed description of the preferred embodiments, and appended claims and drawings.

DETAILED DESCRIPTION OF PREFERRED EMBODIMENTS

Figure 1:
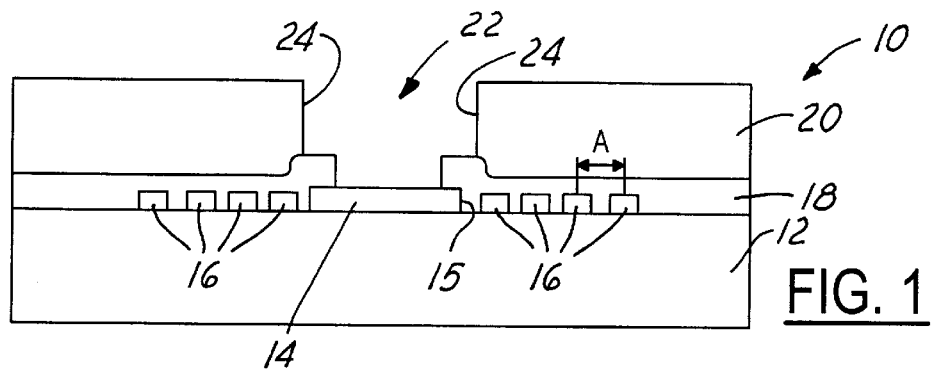
FIG. 1 is a sectional view of the semiconductor device including a plurality of misalignment ruler markers formed in the semiconductor device according to the present invention.

FIG. 1 is a sectional view of the semiconductor device 10 according to the invention. The semiconductor device 10 may include a silicon base 12 having a plurality of discrete devices formed therein and a plurality of metal interconnect layers separated by dielectric layers (not shown) in a manner known to those skilled in the art. A contact pad or bond pad 14 is formed in the semiconductor device for connection to a discrete device formed in the silicon base 12. The bond pad 14 is made from any of a variety of metals, metal alloys, or metals and other materials including copper, aluminum, nickel, gold and mixtures thereof. A plurality of misalignment ruler markers 16 are also formed in the semiconductor device 10. Preferably the misalignment ruler markers are formed in the semiconductor device 10 at the same time the bond pad 14 is formed, and preferably are made from the same material as the bond pad 14. The bond pad 14 and the plurality of misalignment ruler markers 16 may be formed in the semiconductor device 16 using metallization and photolithography techniques to leave selectively deposited metal materials defining the bond pad 14 and the plurality of misalignment ruler markers 16. The misalignment ruler markers 16 are spaced apart from each other in a uniform distance as shown by line A, which preferably is about 1 micrometer. Typically the semiconductor device 10 includes a first passivation layer 18 (such as silicon dioxide) deposited over the plurality of misalignment ruler markers 16 and a portion of the bond pad 14 to provide an opening therein for electrical contact to the bond pad 14. A masking material is selectively deposited over the semiconductor device and on top of the first photoresist layer 18. Preferably the masking material is a dry film photoresist 20 which is deposited, patterned and developed to provide an opening 22 in the dry film photoresist layer down to the bond pad 14. The dry film photoresist layer opening 22 is defined by side walls 24 of the dry film photoresist layer 20. Once the dry film photoresist layer 20 and opening 22 are formed, the semiconductor device 10 is inspected to determine if the side walls 24 defining the opening 22 are properly aligned over the bond pad 14. Preferably an optical microscope is utilized to view the semiconductor device and determine whether the photoresist opening 22 and the side walls 24 are misaligned within an acceptable tolerance range. If the photoresist opening 22 and side walls 24 are positioned within the acceptable misalignment tolerance range, an under bump metallurgy and an electrically conductive material may be deposited into the photoresist opening 22 to form a bump on a semiconductor device as will be discussed hereafter. However, if the photoresist opening 22 and the side walls 24 are outside of an acceptable misalignment tolerance range, the photoresist layer 22 is stripped from the semiconductor device 10. Thereafter, another photoresist layer is deposited, patterned and developed to form the opening 22 and the semiconductor device is inspected again to determine whether the opening 22 and the side walls 24 are within the acceptable misalignment tolerance range. Preferably the passivation opening 22 and the side walls 24 are within 5 micrometers of the preferred location in order to be within an acceptable misalignment tolerance range.

Figure 2:
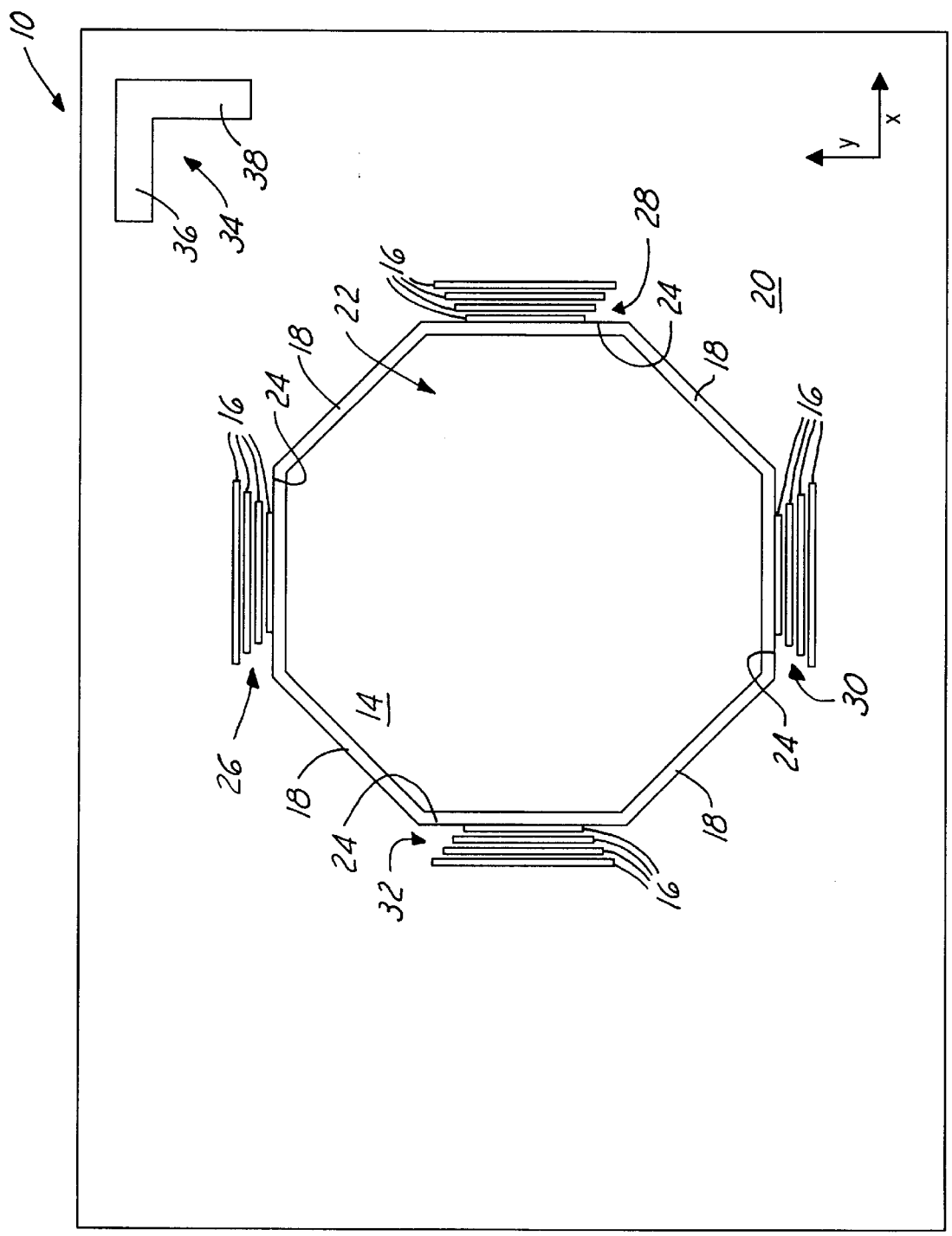
FIG. 2 is a plan view of the semiconductor device including a plurality of misalignment ruler markers formed in the semiconductor device according to the present invention.

FIG. 2 is a plan view of the semiconductor device 10 according to the present invention. This plan view illustrates the photoresist layer 20 and opening 22 therein. Preferably first, second, third, and fourth sets of misalignment ruler markers 26, 28, 30, 32 are provided each having a plurality of spaced apart the misalignment ruler markers 16. As shown in FIG. 2, a first set 26 of misalignment ruler markers 16 is positioned on an opposite side of the bond pad 14 from the third set 30 of misalignment ruler markers 30 so that in any misalignment of the opening 22 in the photoresist layer 20 can be measured in the Y-direction. Likewise, a second set 28 of misalignment ruler markers 16 is positioned on an opposite side of the bond pad 14 from the fourth set 32 of misalignment ruler markers 16 so that any misalignment of the opening 22 in the photoresist layer 20 can be measured in the X-direction. optionally, an alignment orientation mark 34 may be formed in the semiconductor device 10 at the same time that the bond pad 14 and plurality of misalignment ruler markers 16 and is made from the same materials. Preferably the misalignment orientation mark 34 includes a first leg 36 extending in the X- direction, and a second leg 38 extending in the Y- direction. The alignment orientation mark 34 is utilized to properly align the photoresist layer 20 and the patterning, and development of the photoresist layer 20 and forming the opening 22 therein.

Figure 3:
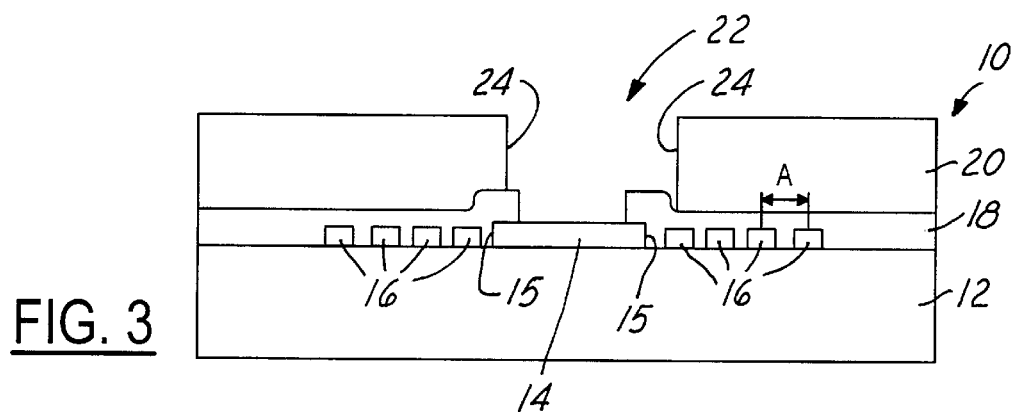
FIG. 3 is a sectional view of a semiconductor device including a plurality of misalignment ruler markers illustrating a dry film photoresist layer in a misaligned positioned, according to the present invention.
Figure 4:
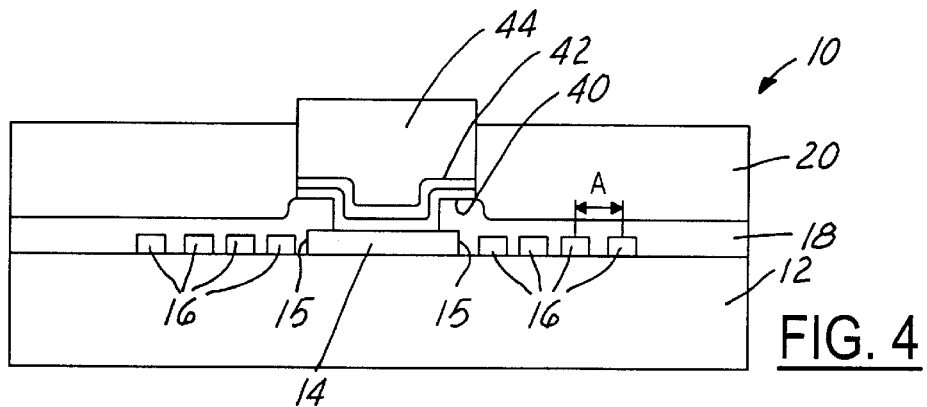
FIG. 4 is a sectional view of the semiconductor device including a plurality of misalignment ruler markers formed in the semiconductor device, with a photoresist layer having an opening formed therein and properly aligned on the semiconductor device, an under bump metallurgy and an electrically conductive bump material deposited in the opening in the photoresist layer according to the present invention.

FIG. 3 is a sectional view of a semiconductor device 10 similar to that shown in FIG. 1 but wherein the photoresist layer 20 is misaligned such that the side wall 22 is overlying one of the misalignment ruler markers 16 and opening 22 partially exposed is one of the markers 16. Preferably the side walls 24 of the photoresist layer 20 are positioned to substantially aligned with the peripherals sides 15 of the bond pad 14. During the misalignment inspection process, the number of misalignment ruler markers 16 in either the X-direction or the Y- direction that are visible are counted to determine the magnitude of the misalignment in both the X-direction and the Y- direction. If the misalignment, if any, is within a predetermined tolerance range, the process of forming a bump on a semiconductor device 10 is continued. If however, the misalignment is greater than a predetermined tolerance range, the photoresist layer 20 is stripped from the semiconductor device 10. A second photoresist layer is deposited over the semiconductor device, patterned and developed to form the opening 22 again and the inspection process repeated. The stripping of the photoresist layer, depositing the photoresist layer and forming an opening therein, and inspecting is repeated until the photoresist opening 22 is properly positioned within the acceptable misalignment tolerance range.

Figure 5:
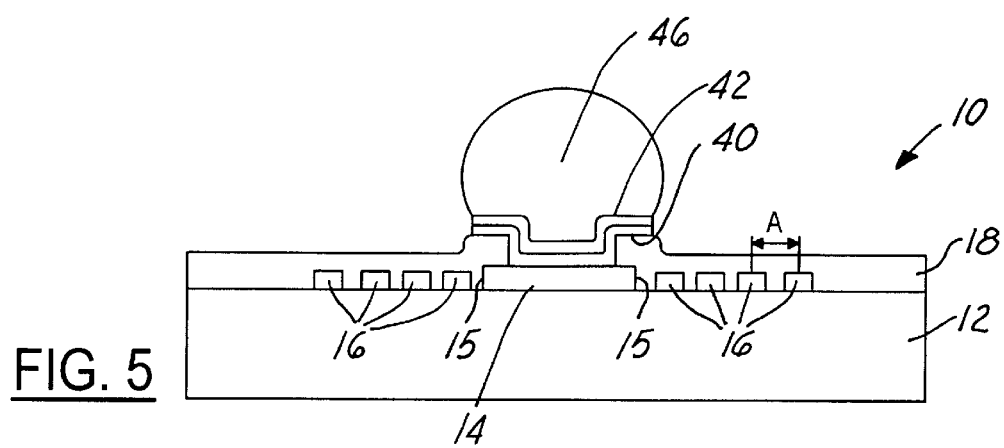
FIG. 5 is sectional view of the semiconductor device of FIG. 4 wherein the photoresist layer has been removed, and the electrically conductive bump material reflown to form a bump on the semiconductor device according to the present invention.

If the photoresist layer opening 22 is properly aligned, under bump metallurgy layers 40, 42 are deposited into the opening in the photoresist layer and an electrically conductive bump material 44 is deposited over the under bump metallurgy layers 40, 42 as shown in FIG. 5. Thereafter, the photoresist layer 20 is stripped and the electrically conductive material 44 is reflown by heating to form a bump 26 on the semiconductor device 10.

Figure 6:
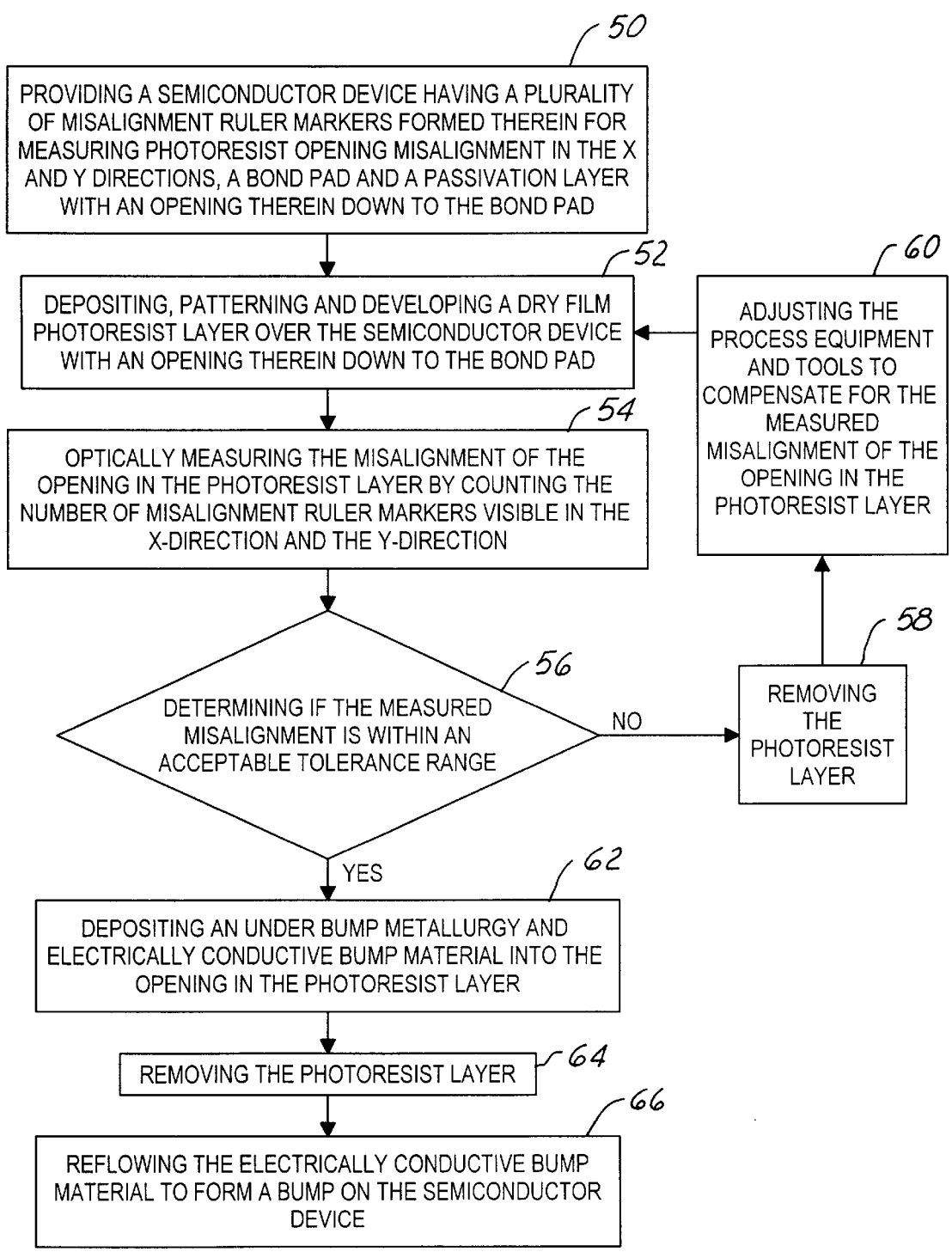
FIG. 6 is a process flow chart illustrating the major acts of a method of forming a bump on a semiconductor device including a unique method of measuring photoresist and/or bump misalignment according to the present invention.

FIG. 6 is a process flow chart illustrating one embodiment of a method according to the present invention. One method includes the action 50 of providing a semiconductor device having a plurality of misalignment ruler markers formed therein for measuring photoresist opening misalignment in the X and Y directions, a bond pad and the passivation layer with an opening therein down to the bond pad. A removable layer is formed over the semiconductor device and includes an opening therein down to the bond pad. Preferably this act 52 includes depositing, patterning and developing a dry photoresist film layer over the semiconductor device to provide an opening therein down to the bond pad. The next act 54 includes optically measuring the misalignment of the opening in the photoresist layer by counting the number of misalignment ruler markers exposed (by the opening) in the X- direction and also in the Y- direction. The next act 56 includes determining if the misalignment is within an acceptable tolerance range, preferably 0–5 microns. If the measured misalignment is outside of the acceptable tolerance range (i.e., greater than 5 microns) then the photoresist layer is removed 58. Then, the next act 62 includes adjusting the process equipment and tools to compensate for the measured misalignment in the opening of the photoresist layer. After the adjustments have been made, the acts 52, 54, 56 are repeated until the measured misalignment is within the acceptable tolerance range. When the measured misalignment is within acceptable tolerance range (0–5 microns), then the next act 62 includes depositing an under bump metallurgy and electrically conductive bump material into the opening in the photoresist layer. The next act 64 includes removing the photoresist layer. Thereafter, the next act 66 includes reflowing the electrically conductive bump material to form a bump on the semiconductor device.

What is claimed is:

1. A method comprising:
   (a) providing a semiconductor device having a plurality of spaced apart misalignment ruler markers formed therein for measuring the misalignment of an opening in a removable layer in the X and Y directions, and a bond pad formed therein;
   (b) depositing a removable layer over the semiconductor device, and wherein the removable layer includes an opening formed therein down to the bond pad; and
   (c) measuring the misalignment of the opening in the removable layer by counting the number of misalignment ruler markers exposed by the opening in the removable layer in the X-direction and in the Y- direction.

2. A method as set forth in claim 1 wherein the plurality of misalignment ruler markers includes at least a first set of spaced apart lines.

3. A method as set forth in claim 1 wherein each of the misalignment ruler markers comprises the same material as the bond pad.

4. A method as set forth in claim 1 wherein the plurality of this alignment ruler markers comprises first, second, third, and fourth sets of spaced apart lines, and wherein the first set of spaced apart lines is positioned on an opposite side of the bond pad from the third set of spaced apart lines so that the first and the third sets of spaced apart lines are usable to measure the misalignment of the opening in the removable layer in the Y- direction, and wherein the second set of spaced apart lines is positioned on an opposite side of the bond pad from the fourth set of spaced apart lines so that the second and fourth set of spaced apart lines are usable to measure the misalignment of the opening in the removable layer in the X- direction.

5. A method as set forth in claim 4 wherein the spaced apart lines of each set are spaced apart from each other an equal distance.

6. A method as set forth in claim 4 wherein the spaced apart lines of each set are spaced apart from each other 1 micron.

7. A method as set forth in claim 1 wherein the removal layer comprises a photoresist.

8. A method as set forth in claim 1 wherein the removable layer comprises a dry film photoresist.

9. A method as set forth in claim 1 further comprising the act of determining whether the measured misalignment of the opening in the removable layer in each of the X-direction and the Y- direction are within an acceptable tolerance range.

10. A method as set forth in claim 1 further comprising the acts of:
    (d) determining whether the measured misalignment of the opening in the removable layer in each of the X-direction and the Y-direction are within an acceptable tolerance range;
    (e) and if the measured misalignment is outside of the acceptable tolerance range then:
    (f) removing the removable layer;
    (g) adjusting the process equipment and tools to compensate for the measured misalignment of the opening in the removable layer; and
    (h) repeating the acts b–d until the measured misalignment is within the acceptable tolerance range.

11. A method as set forth in claim 1 further comprising the acts of:
    (d) determining whether the measured misalignment of the opening in each of the X-direction and the Y-direction are within an acceptable tolerance range;
    (i) if the misalignment is within the acceptable tolerance range then further comprising the acts of:
    (j) depositing an under bump metallurgy into the opening in the removable layer;
    (k) depositing an electrically conductive bump material into the opening in the removable layer and over the under bump metallurgy;
    (1) removing the removable layer; and
    (m) reflowing the electrically conductive bump material to form a bump on the semiconductor device.

12. A method as set forth in claim 1 further comprising the act of viewing the semiconductor device through an optical microscope in order to perform the act of counting the number of misalignment ruler markers.

13. A method comprising:
    (a) providing a semiconductor device having a plurality of spaced apart misalignment ruler markers formed therein for measuring the misalignment of an opening in a removable layer in the X and Y directions, and a bond pad formed therein;
    (b) depositing a removable layer over the semiconductor device, and wherein the removable layer includes an opening formed therein down to the bond pad;
    (c) measuring the misalignment of the opening in the removable layer by counting the number of misalignment ruler markers exposed by the opening in the removable layer in the X- direction and in the Y- direction;

(d) determining if the measured misalignment is within an acceptable tolerance range;

(e) if the measured misalignment is outside of the acceptable tolerance range, and then removing the removable layer, adjusting the process equipment and tools to compensate for the measured misalignment of the opening in the removable layer, and repeating acts b–d until the measured misalignment of the opening is within acceptable tolerance range;

(f) if the measured misalignment of the opening is within an acceptable tolerance range then performing the acts g–i;

(g) depositing an electrically conductive bump material into the opening in the removable layer;

(h) removing the removable layer; and (i) reflowing the electrically conductive bump material to form a bump on the semiconductor device.

14. A method as set forth in claim 13 wherein the removable layer comprises a photoresist layer.

15. A method as set forth in claim 13 wherein the removable layer comprises a dry film photoresist layer.

16. A method as set forth in claim 13 wherein the plurality of misalignment ruler markers includes at least a first set of spaced apart lines.

17. A method as set forth in claim 13 wherein each of the misalignment ruler markers comprises the same material as the bond pad.

18. A method as set forth in claim 13 wherein the plurality of this alignment ruler markers comprises first, second, third, and fourth sets of spaced apart lines, and wherein the first set of spaced apart lines is positioned on an opposite side of the bond pad from the third set of spaced apart lines so that the first and the third sets of spaced apart lines are usable to measure the misalignment of the opening in the removable layer in the Y-direction, and wherein the second set of spaced apart lines is positioned on an opposite side of the bond pad from the fourth set of spaced apart lines so that the second and fourth sets of spaced apart lines are usable to measure the misalignment of the opening in the removable layer in the X-direction.

19. A method as set forth in claim 18 wherein the spaced apart lines of each set are spaced apart from each other an equal distance.

20. A method as set forth in claim 18 wherein the spaced apart lines of each set are spaced apart from each other 1 micron.

* * * * *